United States Patent
Baeg et al.

(10) Patent No.: US 7,089,463 B1
(45) Date of Patent: Aug. 8, 2006

(54) TEST BUFFER DESIGN AND INTERFACE MECHANISM FOR DIFFERENTIAL RECEIVER AC/DC BOUNDARY SCAN TEST

(75) Inventors: Sang Hyeon Baeg, Cupertino, CA (US); Sung Soo Chung, San Jose, CA (US)

(73) Assignee: Cisco Technology Inc., San Jose, CA (US)

( * ) Notice: Subject to any disclaimer, the term of this patent is extended or adjusted under 35 U.S.C. 154(b) by 397 days.

(21) Appl. No.: 10/080,145

(22) Filed: Feb. 20, 2002

(51) Int. Cl.
*G01R 31/28* (2006.01)

(52) U.S. Cl. ............... 714/712; 714/709; 714/727; 714/821; 702/117

(58) Field of Classification Search ............. 714/30, 714/726, 727, 740, 20; 324/512; 327/1; 375/257; 702/117; 340/825.5
See application file for complete search history.

(56) References Cited

U.S. PATENT DOCUMENTS

| | | | | |
|---|---|---|---|---|
| 4,931,791 A | * | 6/1990 | Mallard, Jr. ............. | 340/825.5 |
| 5,050,187 A | * | 9/1991 | Ichie ...................... | 375/257 |
| 5,617,426 A | * | 4/1997 | Koenemann et al. ....... | 714/726 |
| 5,996,102 A | * | 11/1999 | Haulin .................... | 714/740 |
| 6,490,325 B1 | * | 12/2002 | Fiedler et al. ........... | 375/257 |
| 6,662,134 B1 | * | 12/2003 | Moore .................... | 702/117 |
| 6,763,486 B1 | * | 7/2004 | Lai et al. ................. | 714/727 |
| 2002/0172159 A1 | * | 11/2002 | Koenig et al. .......... | 370/241 |

OTHER PUBLICATIONS

"Frequency Detection-Based Boundary-Scan Testing of AC Coupled Nets", Kim et al., International Test Conference Proceedings, Oct. 30-Nov. 1, 2001, pp. 46-53.*

* cited by examiner

*Primary Examiner*—Albert Decady
*Assistant Examiner*—John P. Trimmings
(74) *Attorney, Agent, or Firm*—David B. Ritchie; Thelen Reid & Priest LLP (57) ABSTRACT

A boundary scan test system including a transmitter and a receiver. The system performs DC and AC boundary scan testing of the interconnections between devices. The system addresses fault masking that can occur during testing. Of concern are AC coupled interconnections while providing IEEE 1149.1 DC test compatibility. The test receiver includes an input test buffer and an interface mechanism. The input test buffer has a built-in null detection capability. The interface mechanism includes a technology mapper, one or more detectors, and an integrator. The receiver provides at least partial, if not complete, coverage for at least one of five fault syndromes that can result from single defect conditions in the system.

15 Claims, 9 Drawing Sheets

INPUT TEST BUFFER 22

TEST BUFFER DESIGN AND INTERFACE MECHANISM FOR DIFFERENTIAL RECEIVER AC/DC BOUNDARY SCAN TEST

FIELD OF THE INVENTION

The present invention relates generally to boundary scan testing of interconnections between integrated circuits. More specifically, the present invention relates to differential AC coupled boundary scan testing.

BACKGROUND OF THE INVENTION

Electronic systems generally include at least one printed circuit board (PCB) containing one or more integrated circuit (IC) chips or ICs. ICs typically include input/output (I/O) pins which may be coupled to various interconnects of the PCB. Testing performance of electronic systems which include PCBs and ICs typically requires testing at multiple levels including at the chip level, at the board level, and at the system level. Testing at the board level includes testing interconnects of the PCB. Testing at the system level requires analysis of interconnections between and among the ICs, the PCBs, and other devices both on and off the PCB.

To enhance testability at the board level as well as at the system level, a common design practice at the chip level is to incorporate boundary scan test logic into an IC in accordance with IEEE Standard 1149.1. 1149.1 specifies the function of boundary scan logic known as JTAG, which is named for the Joint Test Action Group, for control of boundary scan testing. Two basic elements of an IC are a core logic and the I/O pins. In accordance with 1149.1, boundary scan cells (BSCs) are inserted between the core logic and the I/O pins of the IC. BSCs are typically inserted for all I/O pins of the plurality of ICs on the PCB and may be used to test the integrity of the interconnections between the plurality of ICs.

Each IC may be controlled by boundary scan logic, in accordance with 1149.1, to operate either in a system mode or in a JTAG test mode. In the system mode, system data signals relating to core functions of the IC are passed through the I/O pins to and from devices external to the IC. In the JTAG test mode, test data are provided by the boundary scan chain for the purpose of testing interconnections between the IC and devices external to the IC. The boundary scan test access port (TAP) controller also provides test control signals which include mode signals, shift signals, clock signals, and update signals, among others, each of which is well known. The mandated public instructions include a bypass instruction, a sample instruction, a preload instruction, and a extest instruction. The extest instruction controls BSCs to perform a boundary scan test among the various ICs.

The IC further includes a test data input (TDI) demultiplexer, a test data output (TDO) multiplexer, a bypass register, an instruction register, an identification register, and a test access port (TAP) controller. The TDI demultiplexer includes an input coupled to receive a test data signal from the boundary scan logic which is typically driven externally to the IC. The TDI demultiplexer includes a first output coupled to a TDI input of a first BSC of the plurality of BSCs in the IC. Each of the BSCs includes a TDI input and a TDO output. Each of BSCs is connected serially from a TDO output to a TDI input to propagate test data signals from one BSC to the next BSC in the chain. The TDI demultiplexer further includes a second output coupled to an input of the core logic, a third output coupled to an input of the bypass register; a fourth output coupled to an input of the instruction register; and a fifth output coupled to an input of the identification register.

The TDO multiplexer includes an output which is coupled to provide a test data signal to another IC or to the boundary scan logic. The TDO multiplexer further includes: a first input coupled to a TDO output of a last BSC of the plurality of BSCs in the IC, a second input coupled to an output of the core logic; a third input coupled to an output of the bypass register; a fourth input coupled to an output of the instruction register, and a fifth input coupled to an output of the identification register. The identification register includes inputs coupled to outputs of the TAP controller. The TAP controller includes inputs coupled to receive a TMS signal, a TCK signal, and a TRST signal from the boundary scan logic.

In general, there are three possible I/O structures for an IC including a two-state I/O structure, a three-state I/O structure, and a bi-directional I/O structure. Each of the three I/O structures provides coupling between the core logic and at least one I/O pin. Any or all of the I/O structures may be used in an IC depending on the particular circumstances. The two-state I/O structure includes a two-state output buffer having an input and an output. The input of the two-state output buffer is coupled to a system data output of the core logic. The output of the two-state output buffer is coupled to an I/O pin. The three-state I/O structure includes a three-state output buffer having an input, an output, and a control input. The input of the three-state output buffer is coupled to a system data output of the core logic. The output of the three-state output buffer is coupled to an I/O pin. The control input of the three-state output buffer is coupled to a three-state system control signal output line of the core logic. The bi-directional I/O structure includes a bi-directional buffer. The bi-directional buffer includes an output buffer element having an input, an output, and a control input and an input buffer element having an input and an output. The control input of the output buffer element is coupled to a bi-directional control signal output line of the core logic. The input of the output buffer element is coupled to a system data output of the core logic. The output of the input buffer element is coupled to a system data received input of the core logic. The output of the output buffer element and the input of the input buffer element are coupled together with an I/O pin.

According to conventional methods and apparatus for boundary scan testing, the BSCs are inserted into the I/O structures between the buffers and the core logic. For a two-state output structure, a BSC is inserted between the core logic and the input of the two-state output buffer. For a three-state output structure, a BSC is inserted between the system data output of the core logic and the input of the three-state output buffer. Also, a BSC is inserted between the three-state control signal output line of the core logic and the control input of the three-state output buffer. For a bi-directional output structure, a BSC is inserted between the system control signal output line of the core logic and the bi-directional output buffer. Also, a bi-directional BSC is inserted between the core logic and the bi-directional output buffer.

IEEE Standard 1149.1 was first adopted in 1990. It has been widely used and has proved to be very successful. 1149.1 has been amended twice to improve it. However, 1149.1 does not address all situations and design practices. One such practice is the inclusion of capacitive coupling in the interconnections between ICs. A capacitor is added either to the connection between the ICs or to one, the other, or both of the I/O pins of the ICs or the PCBs with connectors. The capacitor is designed to reduce noise and block unwanted common mode voltage differences in the interconnection. For discussion, this will be referred to alternatively as either being AC coupled or DC de-coupled.

Figure 1:
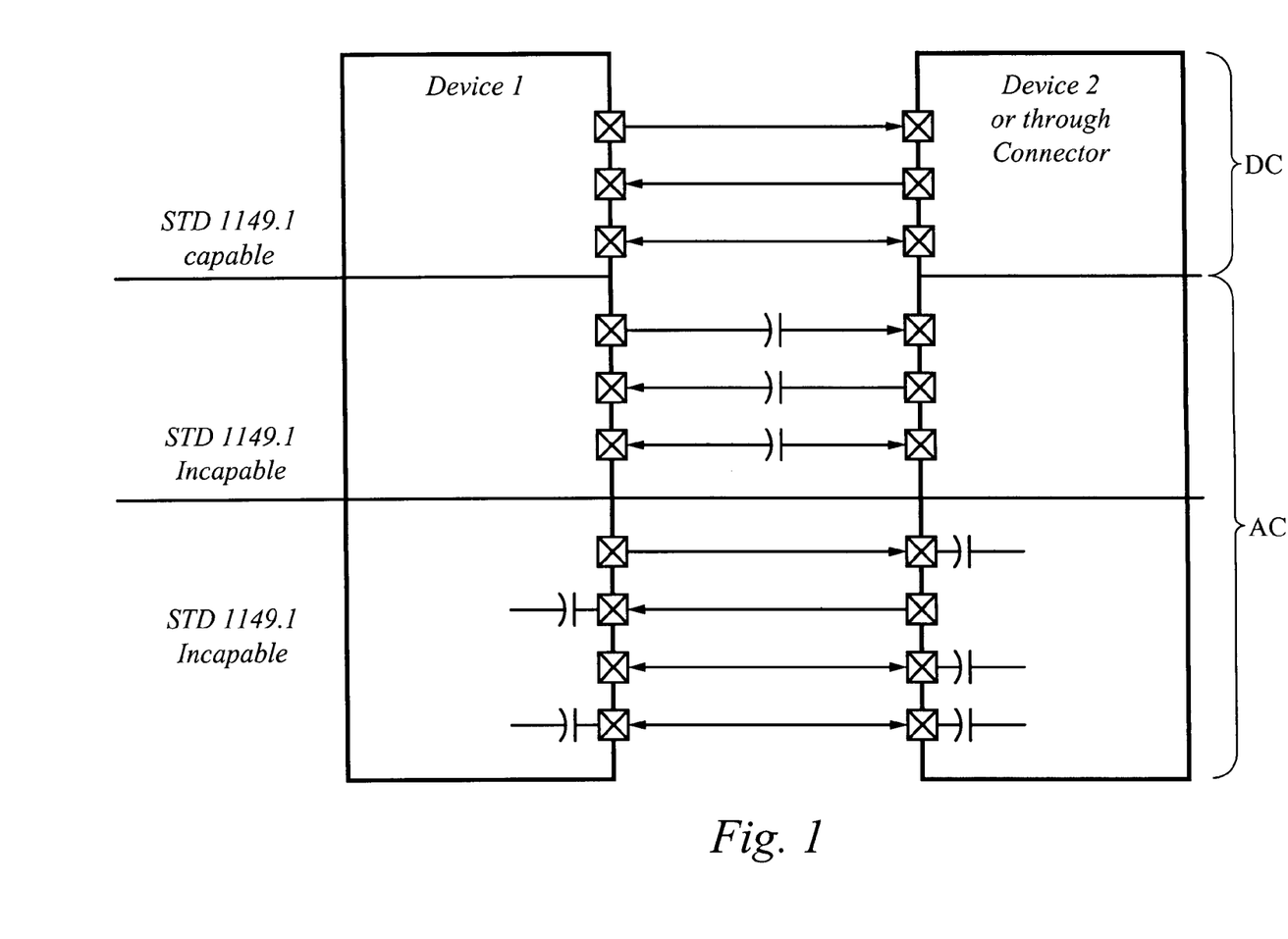
FIG. 1 is a block diagram of ten possible combinations of DC and AC coupled interconnections between two devices.

Turning now to FIG. 1, a block diagram of ten possible combinations of DC and AC coupled interconnections between two devices is shown. The choice of which of the combinations shown that are actually used depends on the circumstances. Because of the capacitor, the value of a signal at the receiving end of the interconnection is no longer the same as the value at the driving end. This assumes that the steady state condition has been reached where all transient values of driven data have subsided. The square wave input signal is transformed at the receiving end into a series of decaying signal spikes corresponding to the transitions of the square wave. The rate of the spike decay depends on the value of the capacitor and the inherent resistance, that is, the RC constant. The result is that conventional 1149.1 testing becomes impractical on AC coupled interconnections. One will note that there are seven possible AC coupled combinations where 1149.1 will not work as compared to only three DC coupled combinations where 1149.1 will work. As the quest for higher signal speeds continues in the future, the use of AC coupling will increase. This becomes especially true with the development of optical communication signals. The consequence will be less and less reliance on conventional 1149.1 testing.

BRIEF DESCRIPTION OF THE INVENTION

A boundary scan test system including a transmitter and a receiver is disclosed. The system performs DC and AC boundary scan testing of the interconnections between devices. The system addresses fault masking that can occur during testing. Of concern are AC coupled interconnections while providing IEEE 1149.1 DC test compatibility. The test receiver includes an input test buffer and an interface mechanism. The input test buffer has a built-in null detection capability. The interface mechanism includes a technology mapper, one or more detectors, and an integrator. The receiver provides at least partial, if not complete, coverage for at least one of five fault syndromes that can result from single defect conditions in the system.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention.

In the drawings.

DETAILED DESCRIPTION

Embodiments of the present invention are described herein in the context of a test buffer design and interface mechanism for a differential receiver for AC/DC boundary scan testing. Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the present invention as illustrated in the accompanying drawings. The same reference indicators will be used throughout the drawings and the following detailed description to refer to the same or like parts.

In the interest of clarity, not all of the routine features of the implementations described herein are shown and described. It will, of course, be appreciated that in the development of any such actual implementation, numerous implementation-specific decisions must be made in order to achieve the specific goals of the developer, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

To the extent applicable, in accordance with the present invention, the components, process steps, and/or data structures may be implemented using various types of operating systems, computing platforms, computer programs, and/or general purpose machines. In addition, those of ordinary skill in the art will recognize that devices of a less general purpose nature, such as hardwired devices, field programmable gate arrays (FPGAs), application specific integrated circuits (ASICs), or the like, may also be used without departing from the scope and spirit of the inventive concepts disclosed herein.

Included among the various testing methods of conventional 1149.1 boundary scan logic is one known as EXTEST. During the EXTEST method, a value, either logic one or logic zero, is loaded onto the latched parallel outputs of the update data registers of the BSCs of the driving IC using a PRELOAD instruction or is loaded with a ShiftDR state while the IC is in the EXTEST instruction. The value being driven is then sampled by the input BSCs of the receiving IC when the TAP controller passes through a CaptureDR state. Finally, by serially shifting out and examining the captured values, one can determine the reliability of the interconnections. This process assumes that the logic value during the time of capture is a static DC value. As noted above, this assumption only holds if the interconnections are DC coupled. As a result, the EXTEST method fails to test AC coupled interconnections.

To address the failure of conventional 1149.1 boundary scan logic in general and the EXTEST method more specifically, what is known as an AC boundary scan test design specification is being developed. In order to deal with AC coupled interconnections, it has been necessary to change the boundary scan logic and hardware. Nevertheless, every effort has been made to design the changes to be backward compatible with conventional testing. As a result, many of the details for AC test function and implementation are the same as those for conventional DC testing.

One point in testing interconnections between ICs is to identify manufacturing defects that result in faults. Faults, however, can only be detected if the input buffer in the receiving IC generates an output that preserves the incoming state and discriminates between a proper and a faulty interconnection. In fact, the input buffer of the receiver may be more important than the AC test patterns themselves. This is at least generally true for differential transmission technology. One positive aspect of the situation is that the AC pattern driving circuit in the transmitter can be simplified. One negative aspect is that the receiver may need more complex circuitry.

The issue with the input buffer revolves around a condition known as fault masking. Generally, input buffers are designed only to output either a logic one or a logic zero. Under conditions of uncertainty, the buffer may output either a logic one or a logic zero by default. If so, the true logic state is unknown and masked by what appears to be a definitive output. The reason for the uncertainty can be based on any one of a number of faults. The uncertainty is an analog signal level where the buffer neither recognizes it as a logic one nor a logic zero. This is known as a null condition. In the case of differential signal lines, there are more possible cases of null conditions due to non-complementing signal conditions where the differential signal pair fails to develop a threshold voltage difference between the two lines. The value of the threshold voltage difference depends in part on the input buffer design. Certain faults, such as a shorted capacitor, can only be detected by combining both DC and AC boundary scan testing.

Unfortunately, there are any number of possible faulty conditions within the analog domain. Consequently, it is difficult and time consuming to enumerate all of the different defect types and their related faults. Fortunately, this is not necessary to demonstrate effective elimination of the fault masking. This is because the manifestations of the typical faults in the receiver are limited in this context. For discussion purposes, these manifestations will be referred to as fault syndromes. There are five fault syndromes that will be identified and discussed further below.

Figure 2:
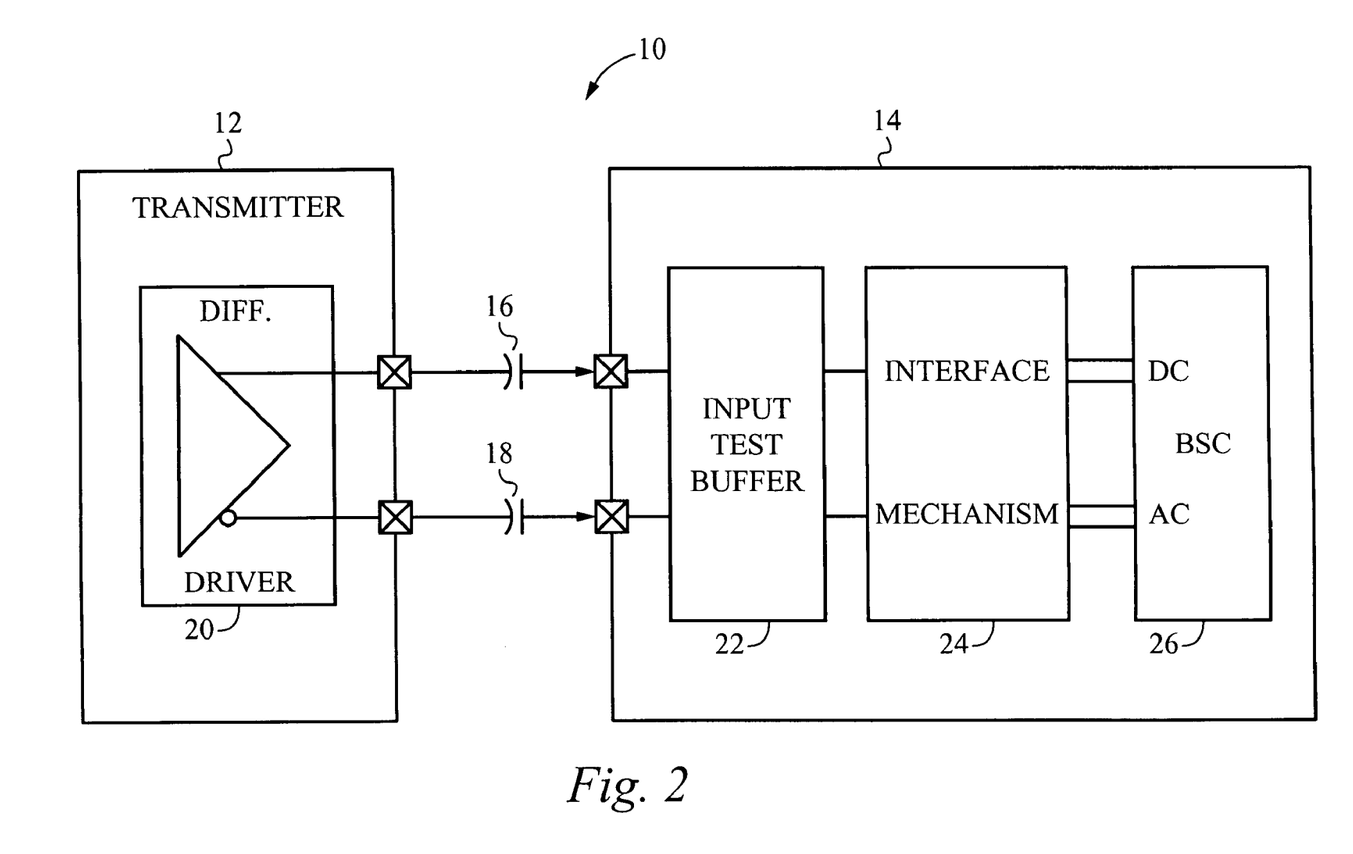
FIG. 2 is a block diagram of a boundary scan test system for a differential AC coupled net.

Turning now to FIG. 2, a boundary scan test system 10 for a differential AC coupled net is shown. In this case, only two devices or ICs are shown, however more could be included. In the discussion that follows, the first IC will be transmitting the test sequence and hence it has been labeled as a transmitter 12. Conversely, the second IC will be receiving the test sequence and it has been labeled as a receiver 14. These roles may reverse under various test sequences. For simplicity, only one differential AC coupled connection is shown having a first capacitor 16 and a second capacitor 18. There may be various other connections between the two ICs and between each IC and other devices not shown. Other types of AC coupled interconnections from FIG. 1 may be substituted for that shown.

The transmitter 12 includes a differential driver 20. The differential driver 20 is a portion of the physical link layer of the transmitter 12. Not shown for simplicity is the logical link layer which one of ordinary skill will recognize is connected internally to the physical link layer. The differential driver 20 takes a logical value from the logical link layer and outputs it on the differential AC coupled connection. One lead carries the signal and the other lead carries the inverse of the signal. The signal that is driven by the transmitter 12 is a square wave, but the signal that is seen by the receiver is a decaying pulse because of the AC coupling capacitors 16 and 18. The first and second capacitors 16 and 18 are a portion of the transmission layer which may also include termination resistor networks and reference bias networks that are not shown.

The receiver 14 includes an input test buffer 22, an interface mechanism 24, and a boundary scan cell (BSC) 26. The input test buffer 22 and the interface mechanism 24 are portions of the physical link layer of the receiver 14. The BSC 26 is a portion of the logical link layer of the receiver 14. For simplicity, elements such as the mission logic buffer and the amplifier and other connections such as the output of the BSC 26 are not shown. The input test buffer 22 receives the test sequence signal from the transmitter 12 and identifies one of a logic one, a logic zero, or a null condition. The interface mechanism 24 further processes any identified null conditions to better detect the test sequence signal. The DC and AC results of the interface mechanism 24, in digital form, are passed to the BSC 26 as part of the test analysis.

Figure 3:
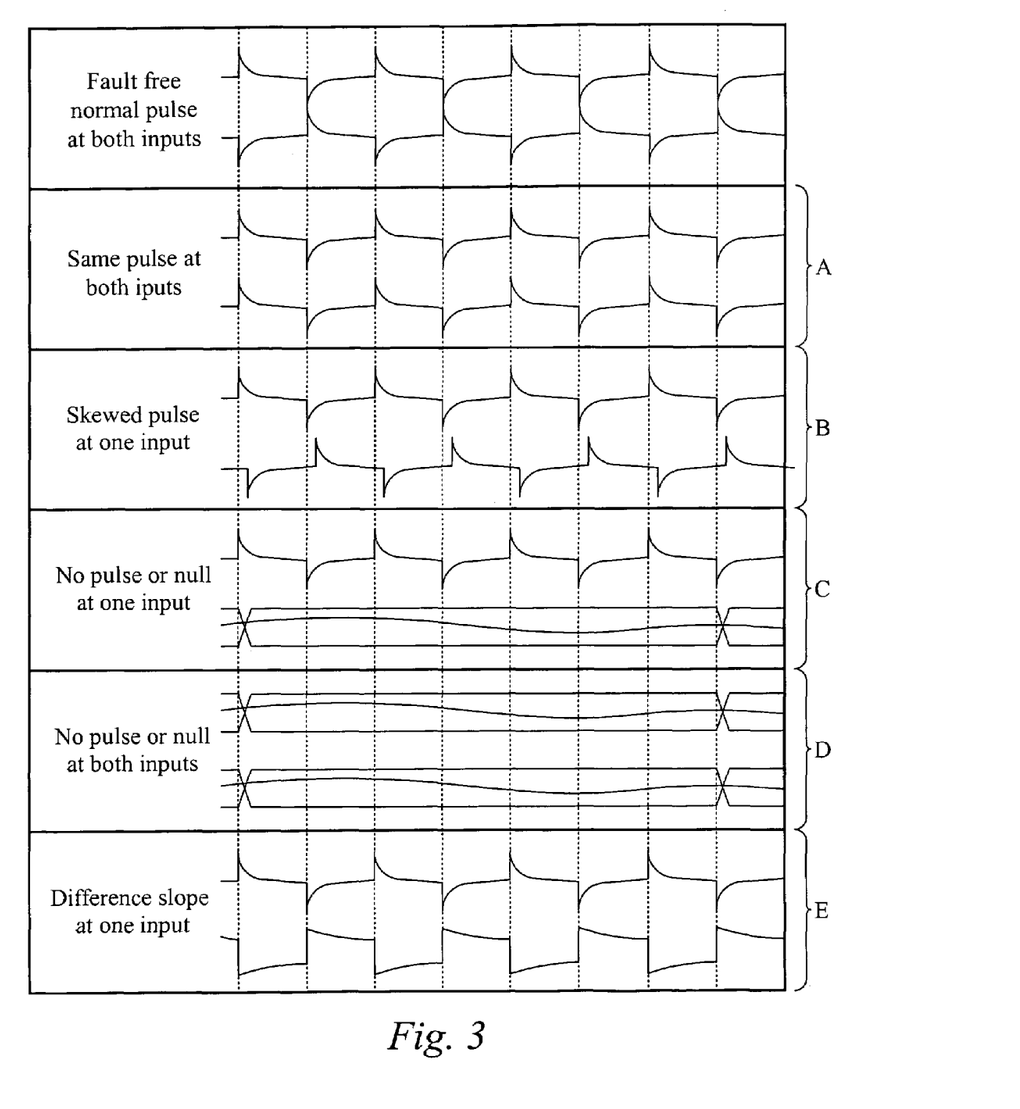
FIG. 3 contains six graphs of input signal pairs to the input test buffer of FIG. 2.

Turning now to FIG. 3, six graphs of input signal pairs to the receiver 14 and the input test buffer 22 of FIG. 2 are shown. The top graph is a fault free sequence of alternating logic ones and logic zeros. The top graph shows the decaying pulse and inverse signal properties of the normal differential signal. This is to be contrasted with the other five graphs which show the five fault syndromes eluded to above. They have been labeled A through E. The graphs are based on a short RC time constant relative to a frequency of square wave signal driven by a driver. Recall that more than one defect may result in one or more fault syndrome. It is assumed that only one defect at a time has occurred. Fault syndrome A exhibits the same pulse at both inputs rather than inverse pulses as in the normal case. Fault syndrome B exhibits one pulse to be skewed or delayed relative to the other pulse. Fault syndrome C exhibits one input to be a constant high or low with no pulse variation or an undetectable null value. Fault syndrome D exhibits both inputs to be a constant high or low with no pulse variation or an undetectable null value. Fault syndrome E exhibits one pulse to have a different slope than the other pulse. The slope of the lower pulse has been exaggerated for demonstration purposes and need not be so extreme to be problematic in practice. Recognition of the five fault syndromes will aid in the elimination of fault masking. This recognition begins with the input test buffer 22.

Figure 4:
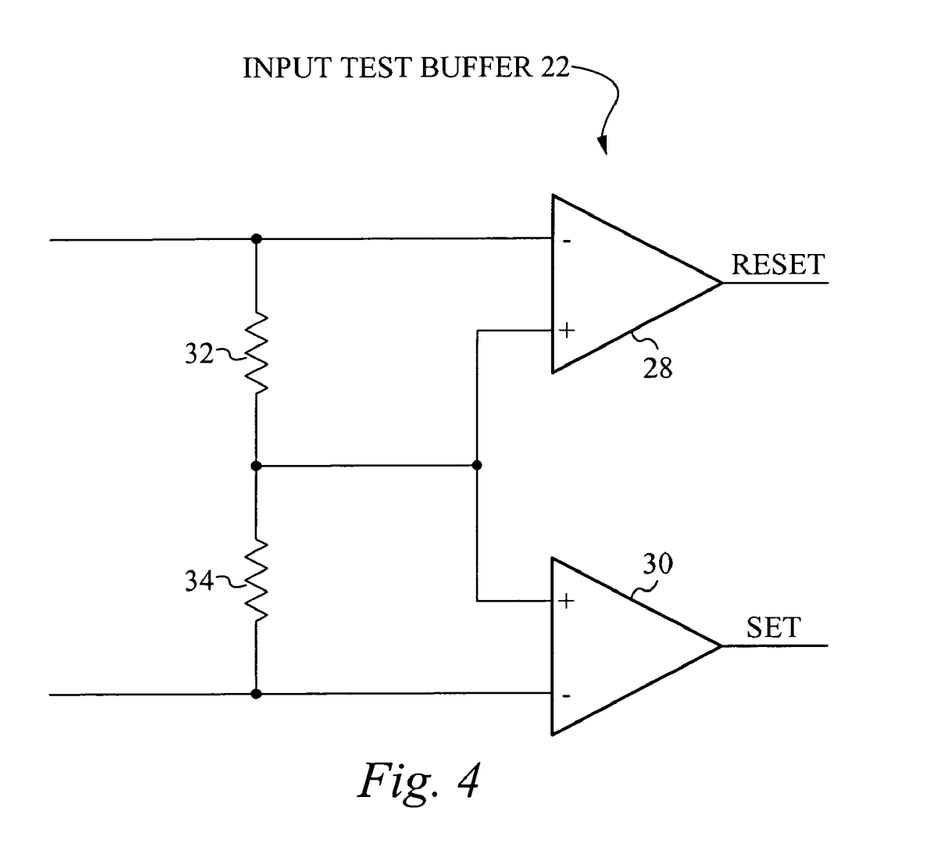
FIG. 4 is a block diagram of a first embodiment of the input test buffer of FIG. 2.

Turning now to FIG. 4, a block diagram of a first embodiment of the input test buffer 22 of FIG. 2 is shown. The actual design of the input test buffer 22 can be selected from a number of designs available in the prior art. The one stipulation is that the design have built-in null detection capability, that is, if the differential voltage between the two signal inputs is not greater than a predefined threshold, then both of the output signals become the same value to identify a null condition. The null condition indicates that one of the five fault syndromes of FIG. 3 has been detected. Here the output signals have been labeled RESET and SET. The input test buffer 22 includes a first amplifier 28, a second amplifier 30, a first resistor 32, and a second resistor 34 connected as shown. The two amplifiers 28 and 30 process the incoming differential AC signal separately and amplify differentially against a common mode voltage provided by the two resistors 32 and 34.

Figure 5:
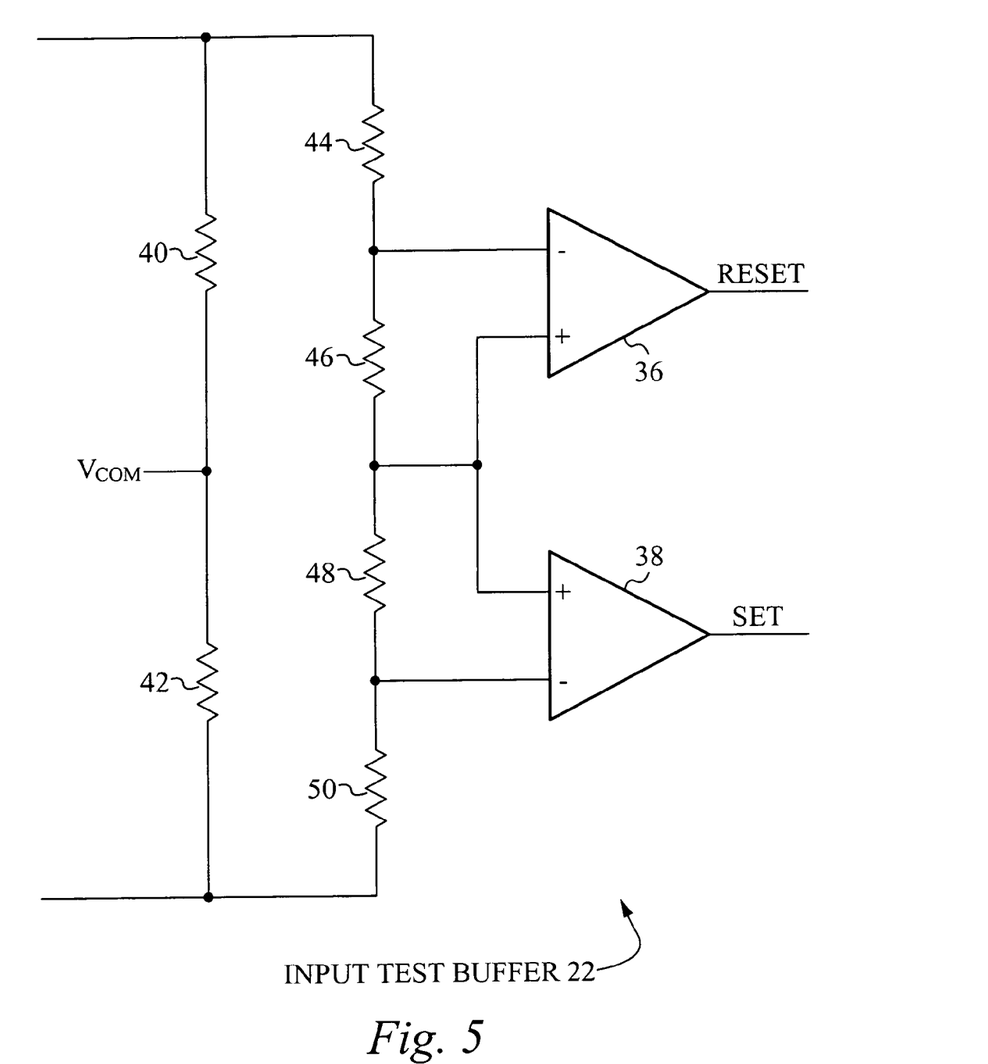
FIG. 5 is a block diagram of a second embodiment of the input test buffer of FIG. 2.

Turning now to FIG. 5, a block diagram of a second embodiment of the input test buffer 22 of FIG. 2 is shown. The input test buffer 22 includes a first amplifier 36, a second amplifier 38, a first resistor 40, a second resistor 42, a third resistor 44, a fourth resistor 46, a fifth resistor 48, and a sixth resistor 50 connected as shown. In this case, the common mode voltage signal Vcom is an input as well. The output signals are still RESET and SET.

Figure 6:
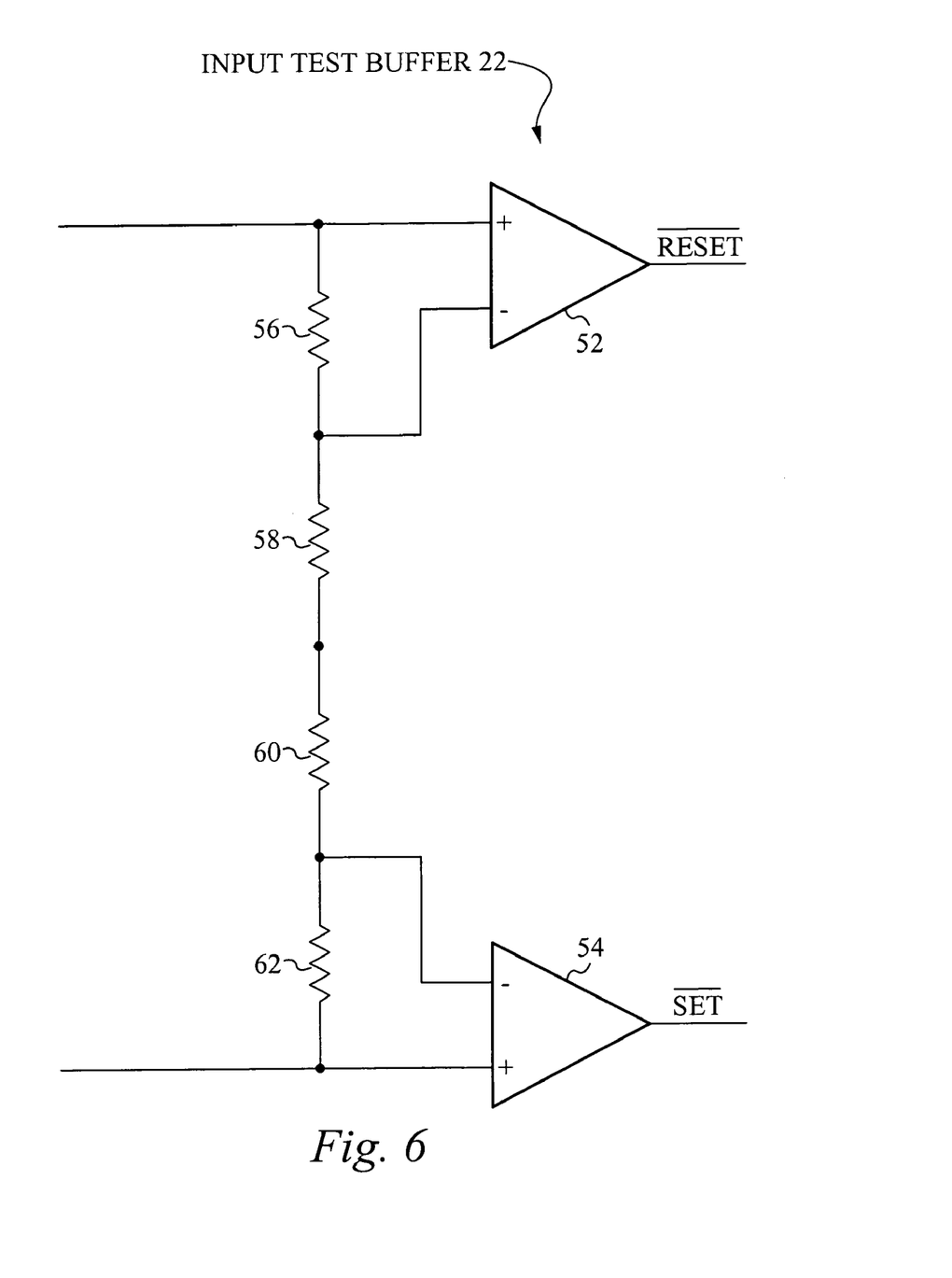
FIG. 6 is a block diagram of a third embodiment of the input test buffer of FIG. 2.

Turning now to FIG. 6, a block diagram of a third embodiment of the input test buffer 22 of FIG. 2 is shown. The input test buffer 22 includes a first amplifier 52, a second amplifier 54, a first resistor 56, a second resistor 58, a third resistor 60, and a fourth resistor 62 connected as shown. In this case, the common mode voltage point is the node between the second resistor 58 and the third resistor 60. The output signals are now RESET BAR and SET BAR.

Figure 7:
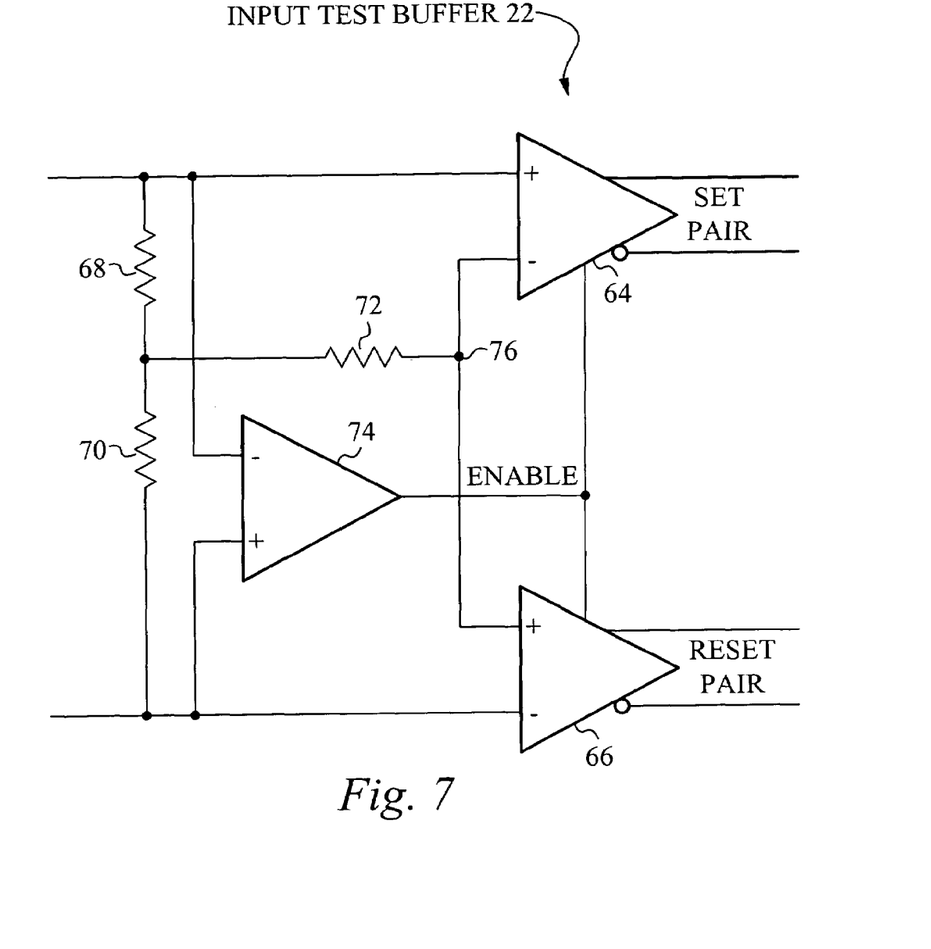
FIG. 7 is a block diagram of a fourth embodiment of the input test buffer of FIG. 2.

Turning now to FIG. 7, a block diagram of a fourth embodiment of the input test buffer 22 of FIG. 2 is shown. The input test buffer 22 includes a first amplifier 64, a second amplifier 66, a first resistor 68, a second resistor 70, and a third resistor 72 connected as shown. In this case, there is also a comparator 74 that generates an ENABLE signal for the first and second amplifiers 64 and 66 when there is no null condition, otherwise amplifiers 64 and 66 are disabled and produce predetermined fixed output values. There may also be a capacitor (not shown) connected between node 76 and ground to function as an integrator in conjunction with the third resistor 72 to form a desired RC time constant. The integrator can be used to provide better test signal tracking ability by filtering out noise and tuning the test input buffer 22. The output signals are now a SET pair and a RESET pair.

Figure 8:
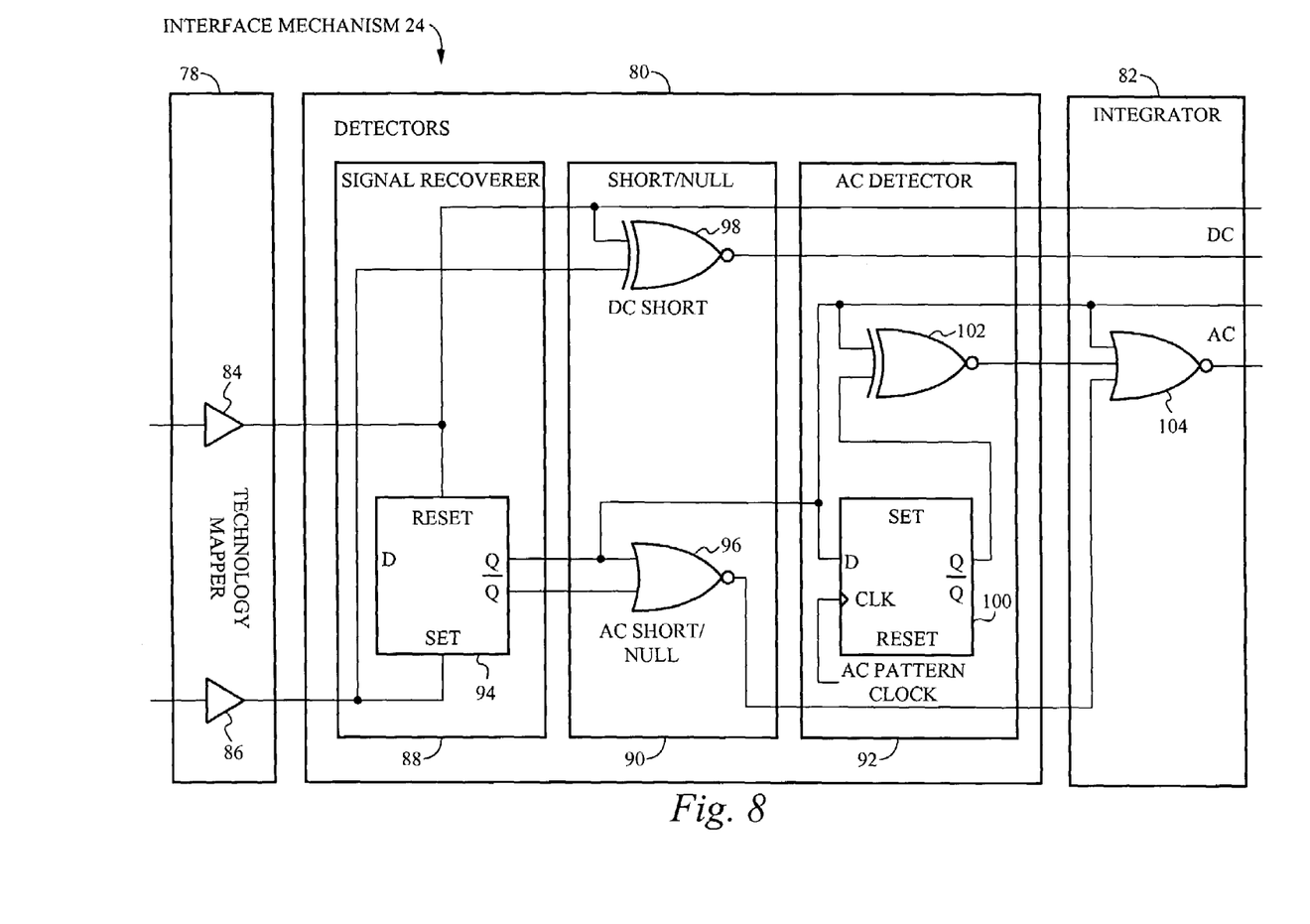
FIG. 8 is block diagram of the interface mechanism of FIG. 2.

Turning now to FIG. 8, a block diagram of the interface mechanism 24 of FIG. 2 is shown. The interface mechanism 24 processes the output signals from the input test buffer 22 of FIG. 2 to detect any of the five fault syndromes of FIG. 3. The interface mechanism 24 includes a technology mapper 78, detectors 80, and an integrator 82. The organization of the various elements is at least partially for discussion purposes and is not strictly required to be as shown for an operative device. Further, one or more of the elements may be combined into the input test buffer 22 if desired.

The technology mapper 78 connects the input test buffer 22 and the interface mechanism 24. It may be the case that the technology mapper 78 is a discrete device or is integral to the input test buffer 22 rather than integral to the interface mechanism 24 as shown. It may also be the case that the technology mapper 78 is deleted altogether. The technology mapper 78 converts or conditions the output of the input test buffer 22. The interface mechanism 24 operates on a Reset and a Set signal as input. If, as in FIGS. 6 and 7, the input test buffer 22 generates some other signal, then the technology mapper 78 converts the signal to a format that can be operated on by the interface mechanism 78. If, as in FIGS. 4 and 5, the input test buffer 22 generates appropriate signals, then only signal conditioning may be needed. As shown in FIG. 8, the input signals from the input test buffer 22 of FIG. 2 are delayed by buffers 84 and 86 to expand the pulse width of the signals. Other forms of signal conditioning are well known in the art and may depend on the circumstances or designer preference.

The detectors 80 include a signal recoverer 88, a short/null detector 90, and an AC detector 92. Not all of the elements shown are required and may not be desired in certain cases. The signal recoverer 88 includes a Reset/Set (RS) latch 94 which has an operating behavior that is well known in the art. Under normal conditions, the RS latch 94 recovers the differential signal pulses from the differential driver 20 of FIG. 2. Under fault conditions, the RS latch 94 starts the analysis process. If both inputs are a logic one, then both outputs are a logic zero by design choice. If both inputs are a logic zero, then both outputs maintain a previously held value. When both inputs change to a logic zero at the same time, then both outputs are indeterminate. This is because the timing of the input signals drives the outputs but the precise timing is not known or controlled thus rendering the outputs indeterminate. One thing that is certain is that the two outputs will have opposite polarity to one another. The output signals will be referred to as Q for the Q output and QB for the Q-bar or not-Q output. In order to overcome the indeterminate state when both inputs change to logic zero, it is possible to add a unit delay gate to the Set signal path to delay the transmission of the signal thus guaranteeing that the two inputs will never be truly simultaneous.

The short/null detector 90 includes an AC short/null detector 96 and a DC short detector 98. The AC short/null detector 96 monitors the outputs of the RS latch 94 for a double logic zero result, that is, both Q and QB are logic zero. This state is flagged as a fault. The AC short/null detector 96 is shown to include a first logic gate. The DC short detector 98 monitors the Reset and Set signals for a state when they are both the same logic value, that is, both logic one or logic zero. This state is flagged as a fault. The DC short detector 98 is shown to include a second logic gate.

The AC detector 92 includes a flip-flop 100 and a third logic gate 102. The flip-flop 100 has as inputs the Q output of the RS latch 94 and an AC Pattern Clock signal that is used for AC boundary scan testing. The Q outputs of the RS latch 94 and the flip-flop 100 are each input to the third logic gate 102. The AC detector 92 also includes a clear logic circuit for the flip-flop 100 which is not shown. The AC detector 92 detects the toggling of the input signal and tracks these signal changes. The length of tracking will depend on other design choices and preference.

The integrator 82 encodes the various fault and data signals into one or more signals to be output to the BSC 26 of FIG. 2. Depending on the BSC 26, the integrator 82 may even be deleted. In this case, a fourth logic gate 104 is utilized to combine three AC fault indicator signals to form a pair of AC output signals, that is, an AC fault indicator and an AC received value. There are also a pair of DC output signals, a DC fault indicator and a DC received value. Taken together, these four signals should provide coverage for fault syndromes A through D of FIG. 3. The fault syndrome E of FIG. 3 may be the result of heterogeneous coupling capacitors 16 and 18 in the differential AC coupled connection of FIG. 2. Since this condition is relatively uncommon, a detector will be presented separately for incorporation into the detectors 80 as desired or required.

Figure 9:
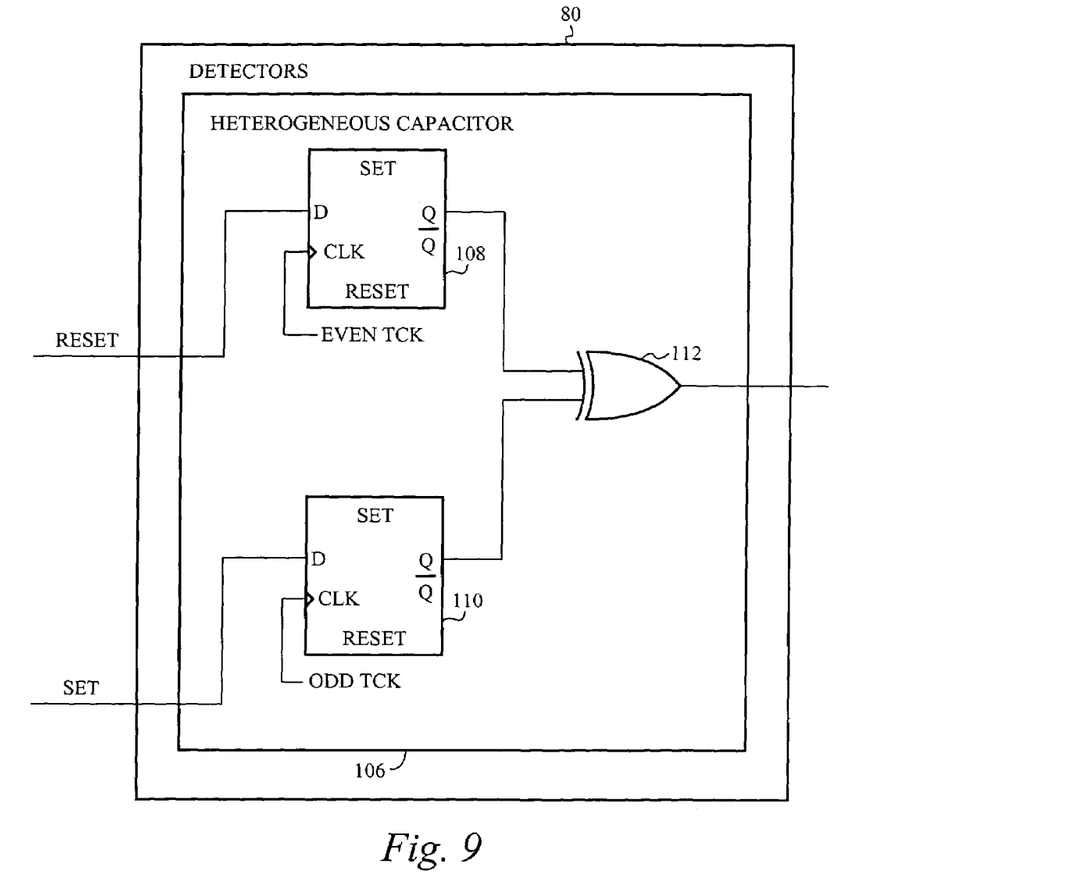
FIG. 9 is a heterogeneous capacitor detector for the detectors of FIG. 8.

Turning now to FIG. 9, a heterogeneous capacitor (HC) detector 106 for the detectors 80 of FIG. 8 is shown. The HC detector 106 operates on the same Reset and Set signals as in FIG. 8. The HC detector 106 includes a reset on even test clock (RET) flip-flop 108, a set on odd test clock (SOT) flip-flop 110, and a fifth logic gate 112. The RET flip-flop 108 uses as a clock input an even test clock (TCK) signal. The SOT flip-flop 110 uses as a clock input an odd TCK signal. The two outputs are combined by the fifth logic gate 112. The combined output signal is passed on to the integrator 82 of FIG. 8 and should provide coverage for fault syndrome E of FIG. 3.

Taken together, the various elements of the boundary scan test system 10 of FIG. 2 and careful test planning should reduce or eliminate the test coverage losses during boundary scan testing that are due to fault masking.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims.

What is claimed is:

1. A method for providing at least partial test coverage for at least one of five fault syndromes that may be encountered during boundary scan testing of differential interconnections between a receiver and a transmitter, the method comprising:
   receiving an analog differential test signal pair;
   converting the analog differential test signal pair into a digital differential test signal pair; and
   detecting a differential null condition in the digital differential test signal pair indicating that one of the five fault syndromes has occurred,
   wherein detecting includes utilization of a common mode reference voltage.

2. An apparatus for providing at least partial test coverage for at least one of five fault syndromes that may be encountered during boundary scan testing of differential interconnections between a receiver and a transmitter, the apparatus comprising:
   means for receiving an analog differential test signal pair;
   means for converting the analog differential test signal pair into a digital differential test signal pair; and
   means for detecting a differential null condition in the digital differential test signal pair indicating that one of the five fault syndromes has occurred,
   wherein detecting includes utilization of a common mode reference voltage.

3. The apparatus as defined in claim 2, wherein the means for detecting comprises means for recovering a test data signal from the transmitter.

4. The apparatus as defined in claim 2 further comprising means for integrating results from the means for detecting, wherein the results are output from the means for integrating.

5. The apparatus as defined in claim 4, wherein the means for integrating preserves incoming signal states in the differential test signal pair during boundary scan testing.

6. A receiver for boundary scan testing of differential interconnections between the receiver and a transmitter, the receiver comprising:
   a differential input test buffer having null condition detection capability, wherein the differential input test buffer measures a voltage differential between differential inputs and is configured to identify a null condition when the measured voltage differential is less than a threshold voltage; and
   an interface mechanism for providing at least partial test coverage for at least one of five fault syndromes associated with the null condition.

7. The receiver as defined in claim 6, wherein the interface mechanism comprises a plurality of detectors for generating data and fault indicator signals.

8. The receiver as defined in claim 6, wherein the interface mechanism further comprises a technology mapper for processing one or more output signals from the differential input test buffer into one or more suitable input signals for the interface mechanism.

9. The receiver as defined in claim 6, wherein the interface mechanism further comprises an integrator for processing generated data and fault indicator signals into one or more suitable output signals for the interface mechanism.

10. The receiver as defined in claim 6, wherein the interface mechanism comprises a plurality of detectors for generating data and fault indicator signals, wherein one of the plurality of detectors is a signal recovery for recovery of the test data signal from the transmitter.

11. The receiver as defined in claim 6, wherein the interface mechanism comprises a plurality of detectors for generating data and fault indicator signals, wherein one of the plurality of detectors is an AC short/null detector.

12. The receiver as defined in claim 6, wherein the interface mechanism comprises a plurality of detectors for generating data and fault indicator signals, wherein one of the plurality of detectors is a DC short detector.

13. The receiver as defined in claim 6, wherein the interface mechanism comprises a plurality of detectors for generating data and fault indicator signals, wherein one of the plurality of detectors is an AC detector.

14. The receiver as defined in claim 6, wherein the interface mechanism comprises a plurality of detectors for generating data and fault indicator signals, wherein one of the plurality of detectors is a heterogeneous capacitor detector.

15. The receiver as defined in claim 14, wherein the heterogeneous capacitor detector comprises a first flip-flop for sampling a first signal on an even test clock signal, a second flip-flop for sampling a second signal on an odd test clock signal, and a logic gate for combining the outputs of the first and second flip-flops.

* * * * *